US011539289B2

(12) United States Patent
Khlat et al.

(10) Patent No.: US 11,539,289 B2
(45) Date of Patent: Dec. 27, 2022

(54) MULTI-LEVEL CHARGE PUMP CIRCUIT

(71) Applicant: Qorvo US, Inc., Greensboro, NC (US)

(72) Inventors: Nadim Khlat, Cugnaux (FR); Jeffrey D. Potts, Mocksville, NC (US); Michael R. Kay, Summerfield, NC (US); Michael J. Murphy, Statesville, NC (US)

(73) Assignee: Qorvo US, Inc., Greensboro, NC (US)

( * ) Notice: Subject to any disclaimer, the term of this patent is extended or adjusted under 35 U.S.C. 154(b) by 183 days.

(21) Appl. No.: 16/807,575

(22) Filed: Mar. 3, 2020

(65) Prior Publication Data

US 2021/0036604 A1 Feb. 4, 2021

Related U.S. Application Data

(60) Provisional application No. 62/882,144, filed on Aug. 2, 2019.

(51) Int. Cl.
*H02M 3/07* (2006.01)
*H02M 1/00* (2006.01)
*H02M 3/158* (2006.01)

(52) U.S. Cl.
CPC ............ *H02M 3/07* (2013.01); *H02M 1/0095* (2021.05); *H02M 3/158* (2013.01)

(58) Field of Classification Search
CPC .............................................. H02M 3/07–078
See application file for complete search history.

(56) References Cited

U.S. PATENT DOCUMENTS

| | | |
|---|---|---|
| 5,510,753 A | 4/1996 | French |
| 5,838,732 A | 11/1998 | Carney |
| 6,107,862 A | 8/2000 | Mukainakano et al. |
| 6,141,377 A | 10/2000 | Sharper et al. |
| 6,141,541 A | 10/2000 | Midya et al. |
| 6,411,531 B1 * | 6/2002 | Nork ..................... H02M 3/073 363/60 |

(Continued)

FOREIGN PATENT DOCUMENTS

| | | |
|---|---|---|
| EP | 3174199 A2 | 5/2017 |
| JP | H03104422 A | 5/1991 |

(Continued)

OTHER PUBLICATIONS

Notice of Allowance for U.S. Appl. No. 16/122,611, dated Jan. 13, 2021, 8 pages.

(Continued)

*Primary Examiner* — Peter M Novak
(74) *Attorney, Agent, or Firm* — Withrow & Terranova, P.L.L.C.

(57) ABSTRACT

A multi-level charge pump (MCP) circuit is provided. The MCP circuit includes a multi-level voltage circuit configured to receive a supply voltage and generate a low-frequency voltage. The multi-level voltage circuit includes a first switch path, a second switch path, and a third switch path each having a respective on-resistance and coupled in parallel between an input node and an output node. In a non-limiting example, the multi-level voltage circuit is configured to activate the first switch path and at least one of the second switch path and the third switch path when the multi-level voltage circuit generates the low-frequency voltage that equals the supply voltage. By activating at least two of the three switch paths to generate the low-frequency voltage, it may be possible to reduce an equivalent resistance of the multi-level voltage circuit, thus helping to improve efficiency and reduce power loss of the MCP circuit.

19 Claims, 9 Drawing Sheets

(56) References Cited

U.S. PATENT DOCUMENTS

| | | |
|---|---|---|
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 7,994,862 B1 | 8/2011 | Pukhovski |
| 8,461,928 B2 | 6/2013 | Yahav et al. |
| 8,493,141 B2 | 7/2013 | Khlat et al. |
| 8,519,788 B2 | 8/2013 | Khlat |
| 8,588,713 B2 | 11/2013 | Khlat |
| 8,718,188 B2 | 5/2014 | Balteanu et al. |
| 8,723,492 B2 | 5/2014 | Korzeniowski |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,018,921 B2 | 4/2015 | Gurlahosur |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,362,868 B2 | 6/2016 | Al-Qaq et al. |
| 9,377,797 B2 | 6/2016 | Kay et al. |
| 9,379,667 B2 | 6/2016 | Khlat et al. |
| 9,445,371 B2 | 9/2016 | Khesbak et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 | 3/2017 | Lerdworatawee |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,103,693 B2 | 10/2018 | Zhu et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 10,862,431 B1 | 12/2020 | Khlat |
| 10,879,804 B2 | 12/2020 | Kim et al. |
| 11,050,433 B1 | 6/2021 | Melanson et al. |
| 11,121,684 B2 | 9/2021 | Henzler et al. |
| 11,128,261 B2 | 9/2021 | Ranta et al. |
| 2002/0167827 A1 | 11/2002 | Umeda et al. |
| 2003/0107428 A1* | 6/2003 | Khouri ............... G11C 5/145 327/536 |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0028271 A1 | 2/2006 | Wilson |
| 2006/0240786 A1 | 10/2006 | Liu |
| 2007/0052474 A1 | 3/2007 | Saito |
| 2007/0258602 A1 | 11/2007 | Vepsalainen et al. |
| 2008/0116960 A1* | 5/2008 | Nakamura ............... H02M 3/07 327/536 |
| 2008/0231358 A1 | 9/2008 | Maemura |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0283534 A1 | 11/2010 | Pierdomenico |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0281597 A1 | 11/2012 | Khlat et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0127548 A1 | 5/2013 | Popplewell et al. |
| 2013/0130724 A1 | 5/2013 | Kumar Reddy et al. |
| 2013/0141064 A1 | 6/2013 | Kay et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0055197 A1 | 2/2014 | Khlat et al. |
| 2014/0057684 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0203869 A1 | 7/2014 | Khlat et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2014/0361837 A1 | 12/2014 | Strange et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0139358 A1 | 5/2015 | Asuri et al. |
| 2015/0155836 A1 | 6/2015 | Midya et al. |
| 2015/0188432 A1 | 7/2015 | Vannorsdel et al. |
| 2015/0234402 A1 | 8/2015 | Kay et al. |
| 2015/0236652 A1 | 8/2015 | Yang et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0050629 A1 | 2/2016 | Khesbak et al. |
| 2016/0065137 A1 | 3/2016 | Khlat |
| 2016/0065139 A1 | 3/2016 | Lee et al. |
| 2016/0099686 A1 | 4/2016 | Perreault et al. |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |

(56) References Cited

U.S. PATENT DOCUMENTS

| | | |
|---|---|---|
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0005619 A1 | 1/2017 | Khlat |
| 2017/0012675 A1 | 1/2017 | Frederick |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat et al. |
| 2018/0076772 A1 | 3/2018 | Khesbak et al. |
| 2018/0123453 A1 | 5/2018 | Puggelli et al. |
| 2018/0152144 A1 | 5/2018 | Choo et al. |
| 2018/0254530 A1 | 9/2018 | Wigney |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2018/0375476 A1 | 12/2018 | Balteanu et al. |
| 2018/0375483 A1 | 12/2018 | Balteanu et al. |
| 2019/0028060 A1 | 1/2019 | Jo et al. |
| 2019/0044480 A1 | 2/2019 | Khlat |
| 2019/0068234 A1 | 2/2019 | Khlat et al. |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222178 A1 | 7/2019 | Khlat et al. |
| 2019/0229623 A1* | 7/2019 | Tsuda .................... H02M 3/073 |
| 2019/0238095 A1 | 8/2019 | Khlat |
| 2019/0253023 A1 | 8/2019 | Yang et al. |
| 2019/0267956 A1 | 8/2019 | Granger-Jones et al. |
| 2019/0222175 A1 | 10/2019 | Khlat et al. |
| 2020/0007090 A1 | 1/2020 | Khlat et al. |
| 2020/0036337 A1 | 1/2020 | Khlat |
| 2020/0106392 A1 | 4/2020 | Khlat et al. |
| 2020/0127608 A1 | 4/2020 | Khlat |
| 2020/0127625 A1 | 4/2020 | Khlat |
| 2020/0136561 A1 | 4/2020 | Khlat et al. |
| 2020/0136563 A1 | 4/2020 | Khlat |
| 2020/0136575 A1 | 4/2020 | Khlat et al. |
| 2020/0144966 A1 | 5/2020 | Khlat |
| 2020/0153394 A1 | 5/2020 | Khlat et al. |
| 2020/0177131 A1 | 6/2020 | Khlat |
| 2020/0204116 A1 | 6/2020 | Khlat |
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |
| 2020/0321917 A1 | 10/2020 | Nomiyama et al. |
| 2020/0382061 A1 | 12/2020 | Khlat |
| 2021/0159590 A1 | 5/2021 | Na et al. |
| 2021/0175896 A1 | 6/2021 | Melanson et al. |
| 2021/0194515 A1 | 6/2021 | Go et al. |
| 2021/0211108 A1 | 7/2021 | Khlat |
| 2021/0281228 A1 | 9/2021 | Khlat |
| 2021/0288615 A1 | 9/2021 | Khlat |
| 2021/0305944 A1 | 9/2021 | Scott et al. |

FOREIGN PATENT DOCUMENTS

| | | |
|---|---|---|
| WO | 2018182778 A1 | 10/2018 |
| WO | 2020206246 A1 | 10/2020 |
| WO | 2021016350 A1 | 1/2021 |
| WO | 2021046453 A1 | 3/2021 |

OTHER PUBLICATIONS

Notice of Allowance for U.S. Appl. No. 16/284,023, dated Jan. 19, 2021, 7 pages.

Notice of Allowance for U.S. Appl. No. 16/416,812, dated Feb. 16, 2021, 8 pages.

Non-Final Office Action for U.S. Appl. No. 16/689,236 dated Mar. 2, 2021, 15 pages.

Notice of Allowance for U.S. Appl. No. 16/435,940, dated Dec. 21, 2020, 7 pages.

Notice of Allowance for U.S. Appl. No. 16/774,060, dated Feb. 3, 2021, 7 pages.

Notice of Allowance for U.S. Appl. No. 16/590,790, dated Jan. 27, 2021, 7 pages.

Notice of Allowance for U.S. Appl. No. 16/661,061, dated Feb. 10, 2021, 7 pages.

Chen, S. et al., "A 4.5 µW 2.4 GHz Wake-Up Receiver Based on Complementary Current-Reuse RF Detector," 2015 IEEE International Symposium on Circuits and Systems (ISCAS), May 24-27, 2015, IEEE, pp. 1214-1217.

Ying, K. et al., "A Wideband Envelope Detector with Low Ripple and High Detection Speed," 2018 IEEE International Symposium on Circuits and Systems (ISCAS), May 27-30, 2018, IEEE, 5 pages.

Notice of Allowance for U.S. Appl. No. 17/011,313, dated Nov. 4, 2021, 8 pages.

Non-Final Office Action for U.S. Appl. No. 16/597,952, dated Nov. 10, 2021, 9 pages.

Quayle Action for U.S. Appl. No. 16/855,154, dated Oct. 25, 2021, 6 pages.

Notice of Allowance for U.S. Appl. No. 17/115,982, dated Nov. 12, 2021, 8 pages.

Non-Final Office Action for U.S. Appl. No. 17/126,561, dated Oct. 14, 2021, 6 pages.

Non-Final Office Action for U.S. Appl. No. 17/073,764, dated Dec. 24, 2021, 22 pages.

International Search Report and Written Opinion for International Patent Application No. PCT/US2021/052151, dated Jan. 4, 2022, 16 pages.

U.S. Appl. No. 16/435,940, filed Jun. 10, 2019.
U.S. Appl. No. 16/774,060, filed Jan. 28, 2020.
U.S. Appl. No. 16/775,554, filed Jan. 29, 2020.
U.S. Appl. No. 16/582,471, filed Sep. 25, 2019.
U.S. Appl. No. 16/589,940, filed Oct. 1, 2019.
U.S. Appl. No. 16/590,790, filed Oct. 2, 2019.
U.S. Appl. No. 16/597,952, filed Oct. 10, 2019.
U.S. Appl. No. 16/661,061, filed Oct. 23, 2019.
U.S. Appl. No. 16/855,154, filed Apr. 22, 2020.

Notice of Allowance for U.S. Appl. No. 16/122,611, dated Apr. 1, 2021, 8 pages.

Notice of Allowance for U.S. Appl. No. 16/689,236 dated Jun. 9, 2021, 7 pages.

Non-Final Office Action for U.S. Appl. No. 16/775,554, dated Jun. 14, 2021, 5 pages.

Non-Final Office Action for U.S. Appl. No. 16/582,471, dated Mar. 24, 2021, 11 pages.

Non-Final Office Action for U.S. Appl. No. 16/597,952, dated May 26, 2021, 7 pages.

Notice of Allowance for U.S. Appl. No. 16/582,471, dated Jun. 22, 2021, 9 pages.

Notice of Allowance for U.S. Appl. No. 16/122,611, dated Dec. 1, 2020, 9 pages.

Advisory Action for U.S. Appl. No. 16/174,535, dated Sep. 24, 2020, 3 pages.

Notice of Allowance for U.S. Appl. No. 16/174,535, dated Oct. 29, 2020, 7 pages.

Final Office Action for U.S. Appl. No. 16/284,023, dated Nov. 3, 2020, 7 pages.

Non-Final Office Action for U.S. Appl. No. 16/416,812, dated Oct. 16, 2020, 8 pages.

Non-Final Office Action for U.S. Appl. No. 16/514,051, dated Nov. 13, 2020, 9 pages.

Quayle Action for U.S. Appl. No. 16/589,940, dated Dec. 4, 2020, 8 pages.

Non-Final Office Action for U.S. Appl. No. 14/836,634, dated May 16, 2016, 9 pages.

Non-Final Office Action for U.S. Appl. No. 14/868,890, dated Jul. 14, 2016, 13 pages.

Non-Final Office Action for U.S. Appl. No. 15/792,909, dated May 18, 2018, 13 pages.

(56) References Cited

OTHER PUBLICATIONS

Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 15/888,300, dated Jan. 14, 2020, 11 pages.
Non-Final Office Action for U.S. Appl. No. 16/122,611, dated Mar. 11, 2020, 16 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Notice of Allowance for U.S. Appl. No. 16/354,234, dated Apr. 24, 2020, 9 pages.
Non-Final Office Action for U.S. Appl. No. 16/246,859, dated Apr. 28, 2020, 9 pages.
Corrected Notice of Allowability for U.S. Appl. No. 15/888,300, dated May 13, 2020, 7 pages.
Notice of Allowance for U.S. Appl. No. 16/155,127, dated Jun. 1, 2020, 8 pages.
Final Office Action for U.S. Appl. No. 16/174,535, dated Jul. 1, 2020, 7 pages.
Non-Final Office Action for U.S. Appl. No. 16/284,023, dated Jun. 24, 2020, 7 pages.
Non-Final Office Action for U.S. Appl. No. 16/435,940, dated Jul. 23, 2020, 6 pages.
Final Office Action for U.S. Appl. No. 15/888,300, dated Feb. 15, 2019, 15 pages.
Final Office Action for U.S. Appl. No. 16/122,611, dated Sep. 18, 2020, 17 pages.
Notice of Allowance for U.S. Appl. No. 16/246,859, dated Sep. 18, 2020, 8 pages.
Quayle Action for U.S. Appl. No. 16/421,905, dated Aug. 25, 2020, 5 pages.
Non-Final Office Action for U.S. Appl. No. 16/774,060, dated Aug. 17, 2020, 6 pages.
Wan, F. et al., "Negative Group Delay Theory of a Four-Port RC-Network Feedback Operational Amplifier," IEEE Access, vol. 7, Jun. 13, 2019, IEEE, 13 pages.
Notice of Allowance for U.S. Appl. No. 16/834,049, dated Jun. 24, 2021, 8 pages.
Notice of Allowance for U.S. Appl. No. 16/582,471, dated Feb. 1, 2022, 9 pages.
International Search Report and Written Opinion for International Patent Application No. PCT/US2021/050892, dated Jan. 5, 2022, 20 pages.
International Search Report and Written Opinion for International Patent Application No. PCT/US2021/054141 dated Jan. 25, 2022, 15 pages.
Non-Final Office Action for U.S. Appl. No. 17/032,553, dated Mar. 21, 2022, 4 pages.
International Search Report and Written Opinion for International Patent Application No. PCT/US2021/052830, dated Jan. 24, 2022, 13 pages.
Notice of Allowance for U.S. Appl. No. 17/148,064, dated Aug. 18, 2022, 8 pages.
Non-Final Office Action for U.S. Appl. No. 17/163,642, dated Aug. 17, 2022, 9 pages.
Final Office Action for U.S. Appl. No. 17/032,553, dated Jul. 29, 2022, 6 pages.
Final Office Action for U.S. Appl. No. 17/073,764, dated Jun. 1, 2022, 22 pages.
Advisory Action for U.S. Appl. No. 17/073,764, dated Aug. 23, 2022, 3 pages.
Extended European Search Report for European Patent Application No. 22153526.3, dated Jul. 13, 2022, 9 pages.
International Preliminary Report on Patentability for International Patent Application No. PCT/US2021/052151, dated Oct. 13, 2022, 21 pages.
International Preliminary Report on Patentability for International Patent Application No. PCT/US2021/054141, dated Sep. 29, 2022, 20 pages.
Non-Final Office Action for U.S. Appl. No. 17/146,765, dated Sep. 7, 2022, 10 pages.
Notice of Allowance for U.S. Appl. No. 17/032,553, dated Oct. 11, 2022, 7 pages.
Non-Final Office Action for U.S. Appl. No. 17/073,764, dated Sep. 30, 2022, 13 pages.

\* cited by examiner

MULTI-LEVEL CHARGE PUMP CIRCUIT

RELATED APPLICATIONS

This application claims the benefit of U.S. provisional patent application Ser. No. 62/882,144, filed on Aug. 2, 2019, the disclosure of which is incorporated herein by reference in its entirety.

FIELD OF THE DISCLOSURE

The technology of the disclosure relates generally to a charge pump circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

Fifth-generation (5G) radio access technology (RAT) has been widely regarded as the next wireless communication technology beyond the conventional third-generation (3G) and fourth-generation (4G) RATs as the 5G RAT is expected to enable significantly higher data rates, improved coverage range, enhanced signaling efficiency, and reduced latency compared to the 3G and 4G RATs. Nevertheless, a 5G-capable mobile communication device may still need to support the 3G and 4G RATs for backward compatibility.

The 5G-capable mobile communication device is typically required (e.g., by regulatory authority, industrial standard, and/or design specification) to transmit a wireless communication signal(s) in a specific RAT based on a specific power. For example, the 5G-capable mobile communication device is required to transmit a 5G wireless communication signal(s) with a maximum effective isotropic radiated power (EIRP) of 43 dBm in a 5G band(s). As such, the 5G-capable mobile communication device typically employs a power amplifier(s) to amplify the wireless communication signal(s) to the specific power prior to transmission. Envelope tracking (ET) is a technology designed to improve operating efficiency of the power amplifier(s) to help reduce power consumption and thermal dissipation in the 5G-capable mobile communication device. In this regard, it may be desirable to consistently improve the operating efficiency of the power amplifier(s) across different RATs.

SUMMARY

Embodiments of the disclosure relate to a multi-level charge pump (MCP) circuit. The MCP circuit includes a multi-level voltage circuit configured to receive a supply voltage via an input node and generate a low-frequency voltage corresponding to the supply voltage at an output node. The multi-level voltage circuit includes a first switch path, a second switch path, and a third switch path coupled in parallel between the input node and the output node. Each of the first switch path, the second switch path, and the third switch path has a respective on-resistance. In a non-limiting example, the multi-level voltage circuit is configured to activate the first switch path and at least one of the second switch path and the third switch path when the multi-level voltage circuit generates the low-frequency voltage that equals the supply voltage. By activating at least two of the three switch paths to generate the low-frequency voltage, it may be possible to reduce an equivalent resistance of the multi-level voltage circuit, thus helping to improve efficiency and reduce power loss of the MCP circuit.

In one aspect, an MCP circuit is provided. The MCP circuit includes an MCP. The MCP includes a multi-level voltage circuit. The multi-level voltage circuit includes an input node that receives a supply voltage. The multi-level voltage circuit also includes an output node that outputs a low-frequency voltage. The multi-level voltage circuit also includes a first switch path having a first on-resistance and is coupled between the input node and the output node. The multi-level voltage circuit also includes a second switch path having a second on-resistance and is coupled between the input node and the output node in parallel to the first switch path. The multi-level voltage circuit also includes a third switch path having a third on-resistance and is coupled between the input node and the output node in parallel to the first switch path and the second switch path. The MCP circuit also includes a control circuit. The control circuit is configured to activate the first switch path and at least one of the second switch path and the third switch path to cause the multi-level voltage circuit to output the low-frequency voltage at the supply voltage with an equivalent resistance smaller than the first on-resistance.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-level charge pump (MCP) circuit. The MCP circuit includes a multi-level voltage circuit configured to receive a supply voltage via an input node and generate a low-frequency voltage corresponding to the supply voltage at an output node. The multi-level voltage circuit includes a first switch path, a second switch path, and a third switch path coupled in parallel between the input node and the output node. Each of the first switch path, the second switch path, and the third switch path has a respective on-resistance. In a non-limiting example, the multi-level voltage circuit is configured to activate the first switch path and at least one of the second switch path and the third switch path when the multi-level voltage circuit generates the low-frequency voltage that equals the supply voltage. By activating at least two of the three switch paths to generate the low-frequency voltage, it may be possible to reduce an equivalent resistance of the multi-level voltage circuit, thus helping to improve efficiency and reduce power loss of the MCP circuit.

Figure 1A:
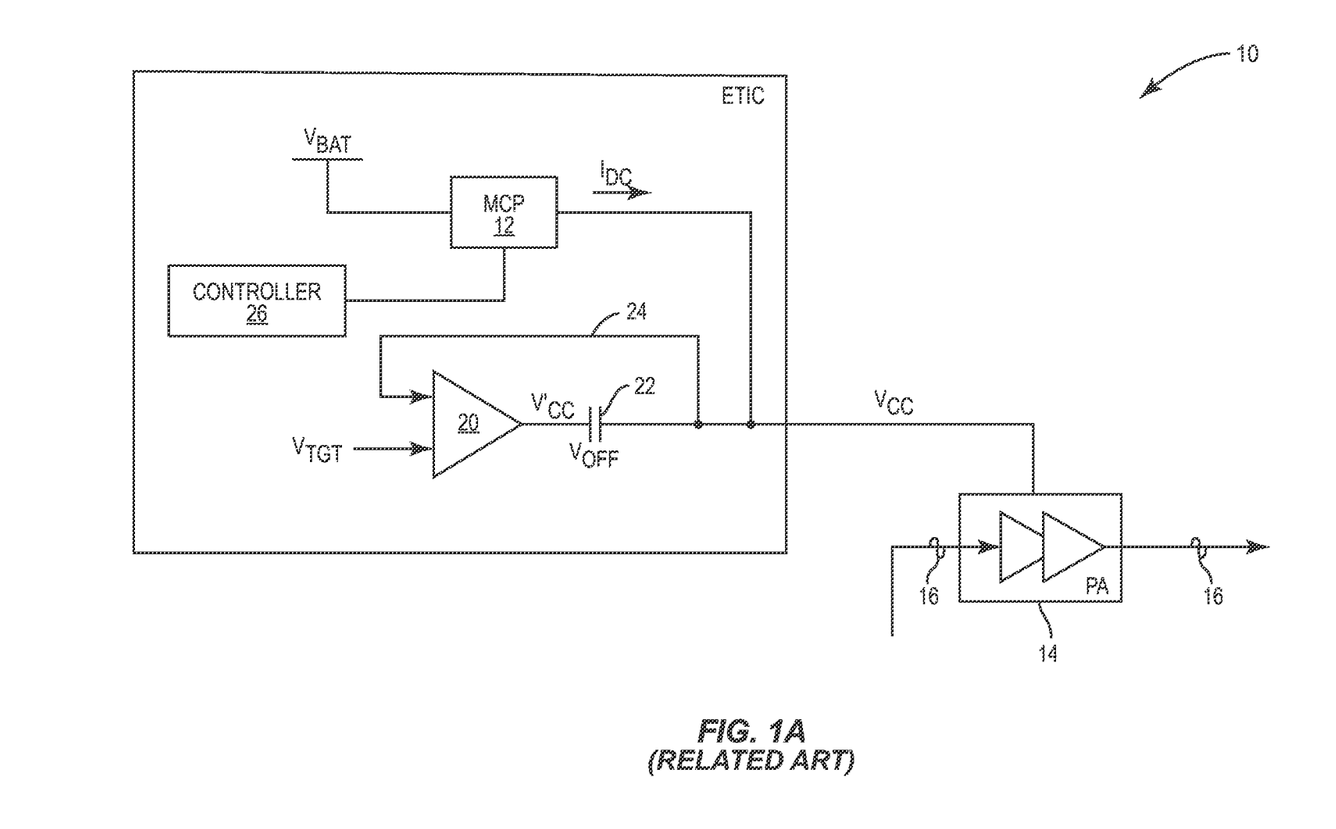
FIG. 1A is a schematic diagram of an exemplary existing power amplifier apparatus that includes an existing multi-level charge pump (MCP) configured to generate a low-frequency current based on a supply voltage.
Figure 1B:
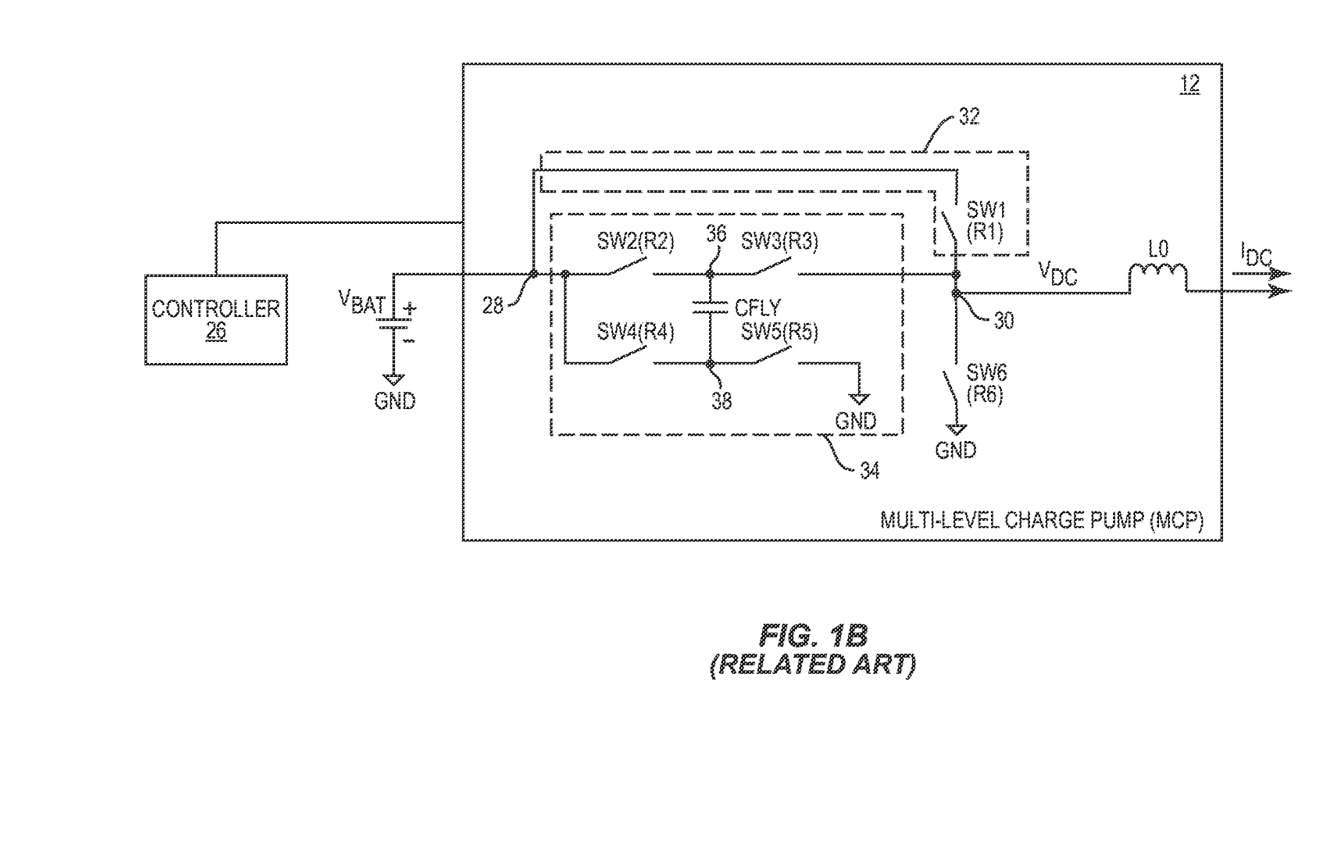
FIG. 1B is a schematic diagram providing an exemplary illustration of the existing MCP in the power amplifier apparatus of FIG. 1A.
Figure 2:
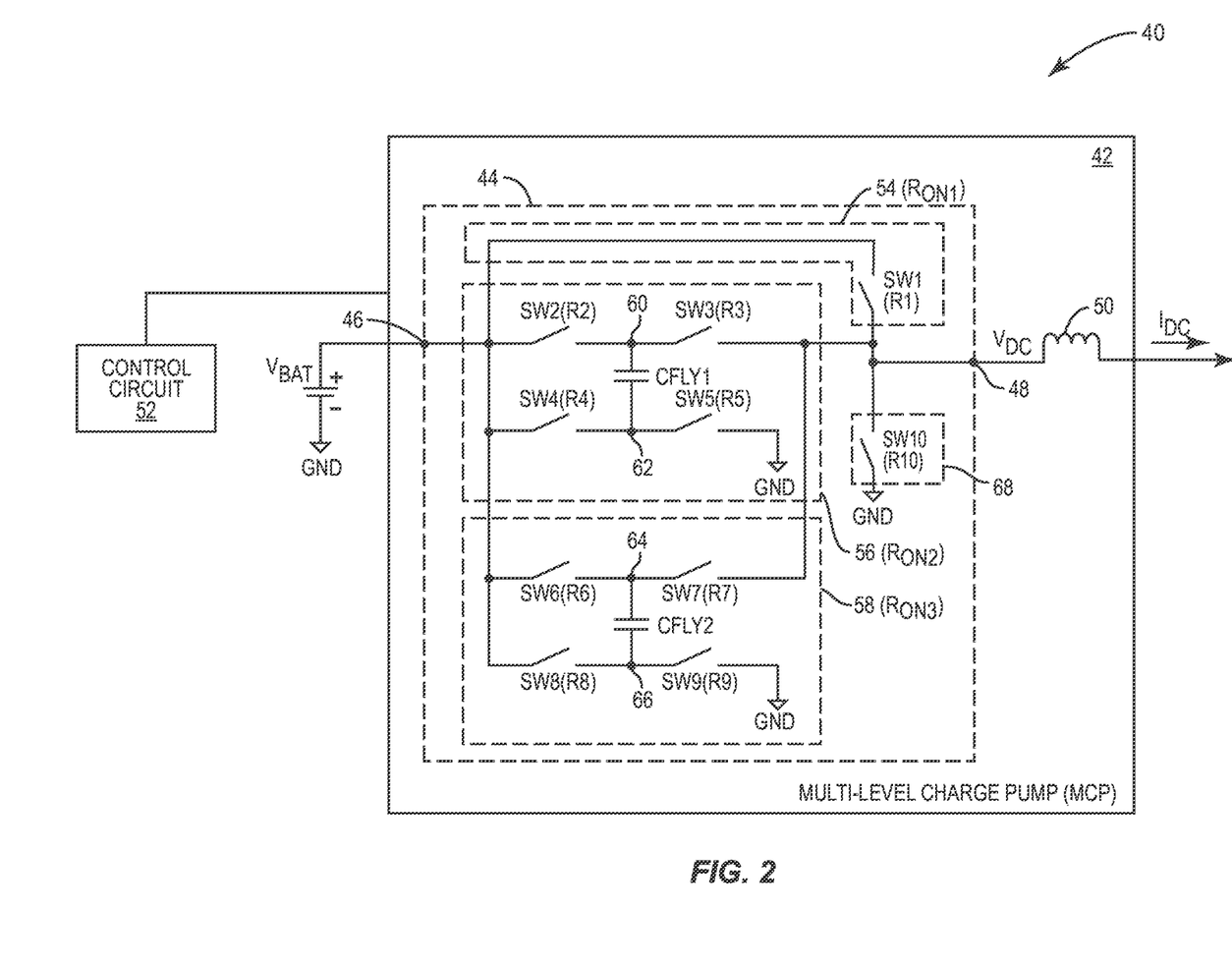
FIG. 2 is a schematic diagram of an exemplary MCP circuit configured according to an embodiment of the present disclosure to reduce equivalent resistance in a buck mode operation and prolong duty cycle in a boost mode operation.

Before discussing the MCP circuit of the present disclosure starting at FIG. 2, a brief overview of an exemplary existing power amplifier apparatus having an existing MCP is first provided with reference to FIGS. 1A-1B to help explain operational principles of the MCP in the context of envelope tracking (ET) and average power tracking (APT) power management. In this regard, FIG. 1A is a schematic diagram of an exemplary existing power amplifier apparatus 10 that includes an existing MCP 12 configured to generate a low-frequency current (e.g., a direct current) $I_{DC}$ based on a supply voltage $V_{BAT}$.

The existing power amplifier apparatus 10 includes a power amplifier(s) 14 configured to amplify a radio frequency (RF) signal 16 based on a modulated voltage $V_{CC}$. The existing power amplifier apparatus 10 also includes an envelope tracking integrated circuit (ETIC) 18 configured to generate the modulated voltage $V_{CC}$.

The RF signal 16 may be a conventional third-generation (3G) or fourth-generation (4G) RF signal (e.g., long-term evolution (LTE)) to be communicated in a conventional RF spectrum below 6 GHz. In this regard, the RF signal 16 may exhibit a lower peak-to-average ratio (PAR). Accordingly, the ETIC 18 can be configured to generate the modulated voltage $V_{CC}$ as an APT modulated voltage.

The RF signal 16 may also be a fifth-generation (5G) RF signal to be communicated in a millimeter wave (mmWave) spectrum that is typically higher than 18 GHz. As such, the RF signal 16 may exhibit a higher PAR compared to the conventional 3G and 4G RF signals. Thus, to help improve operating efficiency and/or linearity of the power amplifier(s) 14, the ETIC 18 is configured to generate the modulated voltage $V_{CC}$ as an ET modulated voltage $V_{CC}$.

In this regard, the ETIC 18 includes a voltage amplifier 20 configured to generate an initial ET modulated voltage $V'_{CC}$ based on an ET modulated target voltage $V_{TGT}$. The ET modulated target voltage $V_{TGT}$ is so generated to correspond to a time-variant target voltage envelope that tracks (rises and falls) in accordance to a time-variant power envelope of the RF signal 16. Accordingly, the voltage amplifier 20 may generate the initial ET modulated voltage $V'_{CC}$ in accordance to the time-variant power envelope of the RF signal 16.

The ETIC 18 can also include an offset capacitor 22 coupled to the voltage amplifier 20. The offset capacitor 22 is configured to raise the initial ET modulated voltage $V'_{CC}$ by a constant offset voltage $V_{OFF}$ to generate the ET modulated voltage $V_{CC}$ ($V_{CC}=V'_{CC}+V_{OFF}$). Like the initial ET modulated voltage $V'_{CC}$, the ET modulated voltage $V_{CC}$ also tracks the time-variant power envelope of the RF signal 16. The ETIC 18 may further include a feedback path 24 configured to provide a copy of the ET modulated voltage $V_{CC}$ to the voltage amplifier 20. Accordingly, the voltage amplifier 20 may adjust the initial ET modulated voltage $V''_{CC}$ such that the ET modulated voltage $V_{CC}$ can better track the time-variant power envelope of the RF signal 16.

The ETIC 18 can be configured to include the MCP 12 to provide the low-frequency current $I_{DC}$ to the power amplifier(s) 14. The ETIC 18 can be configured to include a controller 26. As discussed next in FIG. 1B, the controller 26 may control the MCP to adapt (increase or decrease) the low-frequency current $I_{DC}$ in accordance to the time-variant power envelope of the RF signal 16.

FIG. 1B is a schematic diagram providing an exemplary illustration of the existing MCP 12 in the existing power amplifier apparatus 10 of FIG. 1A. Common elements between FIGS. 1A and 1B are shown therein with common element numbers and will not be re-described herein.

The MCP 12 includes an input node 28 that receives a supply voltage $V_{BAT}$ (e.g., a battery voltage) and an output node 30 that outputs a low-frequency voltage (e.g., a constant voltage) $V_{DC}$. The MCP 12 includes a first switch path 32 and a second switch path 34 that are coupled in parallel between the input node 28 and the output node 30.

The first switch path 32 includes a first switch SW1 having a respective on-resistance R1. Hereinafter, an on-resistance of a switch refers to an inherent resistance when the switch is in a closed (on) state. The second switch path 34 includes a second switch SW2 and a third switch SW3 having respective on-resistances R2 and R3 and are coupled in series between the input node 28 and the output node 30. The second switch path 34 also includes a fourth switch SW4 and a fifth switch SW5 having respective on-resistances R4 and R5 and are coupled in series between the input node 28 and a ground GND. The second switch path 34 also includes a fly capacitor CFLY coupled between a first intermediate node 36 located between the second switch SW2 and the third switch SW3 and a second intermediate node 38 located between the fourth switch SW4 and the fifth switch SW5. The existing MCP 12 also includes a sixth switch SW6, which has a respective on-resistance R6, coupled between the output node 30 and the ground GND. In a non-limiting example, each of the first switch SW1, the second switch SW2, the third switch SW3, the fourth switch SW4, the fifth switch SW5, and the sixth switch SW6 can be a transistor-based switch.

The existing MCP 12 further includes a power inductor L0 configured to induce the low-frequency current $I_{DC}$ based on the low-frequency voltage $V_{DC}$. In this regard, the existing MCP 12 may be controlled to adapt (increase or decrease) the low-frequency current $I_{DC}$ by increasing or decreasing the low-frequency voltage $V_{DC}$.

In a non-limiting example, the existing MCP 12 can be controlled by the controller 26 to generate the low-frequency voltage $V_{DC}$ at zero volts (0 V), at $V_{BAT}$ (also referred to as "buck mode operation" hereinafter) or at two times $V_{BAT}$ ($2V_{BAT}$) (also referred to as "boost mode operation" hereinafter) to cause the low-frequency current $I_{DC}$ to be adapted. To generate the low-frequency voltage $V_{DC}$ at 0 V, the controller 26 may close the sixth switch SW6 to couple the output node 30 to the ground GND. To generate the low-frequency voltage $V_{DC}$ at $V_{BAT}$, the controller 26 can close the first switch SW1 and concurrently open the third switch SW3 and the sixth switch SW6. To generate the low-frequency voltage $V_{DC}$ at $2V_{BAT}$, the controller 26 first closes the second switch SW2 and the fifth switch SW5 to charge the fly capacitor CFLY to the supply voltage $V_{BAT}$. Once the fly capacitor CFLY is charged up to the supply voltage $V_{BAT}$, the controller 26 closes the third switch SW3 and the fourth switch SW4 and concurrently opens the first switch SW1, the second switch SW2, the fifth switch SW5, and the sixth switch SW6.

Notably, the existing MCP 12 may have two obvious shortcomings. First, when the first switch SW1 is closed in the buck mode operation, the existing MCP 12 would exhibit an equivalent resistance dominated by the first on-resistance R1 of the first switch SW1, which may be large enough to cause significant power loss in the MCP 12. Although it may be possible to reduce the on-resistance R1 by increasing the size of the first switch SW1, it may lead to a significant increase in footprint and cost. Second, given that the second switch path 34 must first charge the fly capacitor CFLY to the supply voltage $V_{BAT}$ and subsequently discharge the fly capacitor CFLY in the boost mode operation, the existing MCP 12 may only maintain the low-frequency voltage $V_{DC}$ at $2V_{BAT}$ momentarily. Hence, it may be desirable to reduce the equivalent resistance of the existing MCP 12 in the buck mode operation and to prolong duty cycle in the boost mode operation.

In this regard, FIG. 2 is a schematic diagram of an exemplary MCP circuit 40 configured according to an embodiment of the present disclosure to reduce equivalent resistance in a buck mode operation and prolong duty cycle in a boost mode operation. The MCP circuit 40 includes a MCP 42, which can be provided in the ETIC 18 in the existing power amplifier apparatus 10 of FIG. 1A to replace the existing MCP 12. As discussed in detail below, the MCP 42 can overcome the shortcomings of the existing MCP 12 by effectively reducing equivalent resistance in the buck mode operation and prolonging duty cycle in the boost mode operation. As a result, the MCP 42 may operate with higher efficiency and lower power loss compared to the existing MCP 12.

In a non-limiting example, the MCP 42 includes a multi-level voltage circuit 44 configured to receive a supply voltage $V_{BAT}$ (e.g., a battery voltage) via an input node 46 and generate a low-frequency voltage $V_{DC}$ (e.g., a constant voltage) at an output node 48. The MCP 42 also includes a power conductor 50 coupled to the output node 48 and configured to induce a low-frequency current $I_{DC}$ (e.g., a direct current) based on the low-frequency voltage $V_{DC}$. In examples discussed herein, the multi-level voltage circuit 44 can operate in the buck mode operation to generate the low-frequency voltage $V_{DC}$ at the supply voltage $V_{BAT}$ or in the boost mode operation to generate the low-frequency voltage $V_{DC}$ at twice the supply voltage $V_{BAT}$ ($2V_{BAT}$). In addition, the multi-level voltage circuit may also be configured to generate the low-frequency voltage $V_{DC}$ at 0 V or not to generate the low-frequency voltage $V_{DC}$ at all. The MCP circuit 40 can include a control circuit 52, which can be a microprocessor or a field-programmable gate array (FPGA) for example. The control circuit 52 may control the multi-level voltage circuit 44 to generate the low-frequency voltage $V_{DC}$ at different voltage levels.

In a non-limiting example, the multi-level voltage circuit 44 includes a first switch path 54, a second switch path 56, and a third switch path 58 that are coupled in parallel between the input node 46 and the output node 48. It should be appreciated that the multi-level voltage circuit 44 can be configured to include additional switch paths as needed.

The first switch path 54 includes a first switch SW1 having a respective on-resistance R1 and is coupled between the input node 46 and the output node 48. Herein, the first switch path 54 is said to be activated when the first switch SW1 is closed or deactivated when the first switch SW1 is open. Accordingly, the first switch path 54 has a first on-resistance $R_{ON1}$ that equals the on-resistance R1 ($R_{ON1}$=R1). Notably, the first switch SW1 may be a transistor-based switch or any other type of switch as suitable.

The second switch path 56 includes a second switch SW2 and a third switch SW3 having respective on-resistances R2 and R3. The second switch SW2 and the third switch SW3 are coupled in series between the input node 46 and the output node 48 in parallel to the first switch SW1. Herein, in the buck mode operation, the second switch path 56 is said to be activated when both the second switch SW2 and the third switch SW3 are closed or deactivated when the third switch SW3 is open. Accordingly, in the buck mode operation, the second switch path 56 has a second on-resistance $R_{ON2}$ that equals a sum of the on-resistances R2 and R3 ($R_{ON2}$=R2+R3).

The second switch path 56 also includes a fourth switch SW4 and a fifth switch SW5 having respective on-resistances R4 and R5. The fourth switch SW4 and the fifth switch SW5 are coupled in series between the input node 46 and a ground GND. Herein, in the boost mode operation, the second switch path 56 is said to be activated when both the third switch SW3 and the fourth switch SW4 are closed or deactivated when both the third switch SW3 and the fourth switch SW4 are open.

Notably, each of the second switch SW2, the third switch SW3, the fourth switch SW4, and the fifth switch SW5 can be a transistor-based switch or any other type of switch as suitable. The second switch path 56 also includes a first fly capacitor CFLY1. The first fly capacitor CFLY1 is coupled between a first intermediate node 60 located between the second switch SW2 and the third switch SW3 and a second intermediate node 62 located between the fourth switch SW4 and the fifth switch SW5.

The third switch path 58 includes a sixth switch SW6 and a seventh switch SW7 having respective on-resistances R6 and R7. The sixth switch SW6 and the seventh switch SW7 are coupled in series between the input node 46 and the output node 48 in parallel to the first switch SW1. Herein, in the buck mode operation, the third switch path 58 is said to be activated when both the sixth switch SW6 and the seventh switch SW7 are closed or deactivated when the seventh switch SW7 is open. Accordingly, the third switch path 58 has a third on-resistance $R_{ON3}$ that equals a sum of the on-resistances R6 and R7 ($R_{ON3}$=R6+R7).

The third switch path 58 also includes an eighth switch SW8 and a ninth switch SW9 having respective on-resistances R8 and R9. The eighth switch SW8 and the ninth switch SW9 are coupled in series between the input node 46 and the ground GND. Herein, in the boost mode operation, the third switch path 58 is said to be activated when both the seventh switch SW7 and the eighth switch SW9 are closed or deactivated when both the seventh switch SW7 and the eighth switch SW9 are open.

Notably, each of the sixth switch SW6, the seventh switch SW7, the eighth switch SW8, and the ninth switch SW9 can be a transistor-based switch or any other type of switch as suitable. The third switch path 58 also includes a second fly capacitor CFLY2. The second fly capacitor CFLY2 is coupled between a third intermediate node 64 located between the sixth switch SW6 and the seventh switch SW7 and a fourth intermediate node 66 located between the eighth switch SW8 and the ninth switch SW9.

The multi-level voltage circuit 44 can include a fourth switch path 68 coupled between the output node 48 and the ground GND. The fourth switch path 68 includes a tenth switch SW10 having a respective on resistance R10. The control circuit 52 may close the tenth switch SW10 to activate the fourth switch path 68. When the fourth switch path 68 is activated, the output node 48 is pulled down to the ground GND. As a result, the multi-level voltage circuit 44 generates the low-frequency voltage $V_{DC}$ at 0 V. The fourth switch path 68 is deactivated when the tenth switch SW10 is open.

The control circuit 52 may also deactivate all of the first switch path 54, the second switch path 56, the third switch path 58, and the fourth switch path 68. As a result, the multi-level voltage circuit 44 is floating and therefore does not generate the low-frequency voltage $V_{DC}$.

Figure 3A:
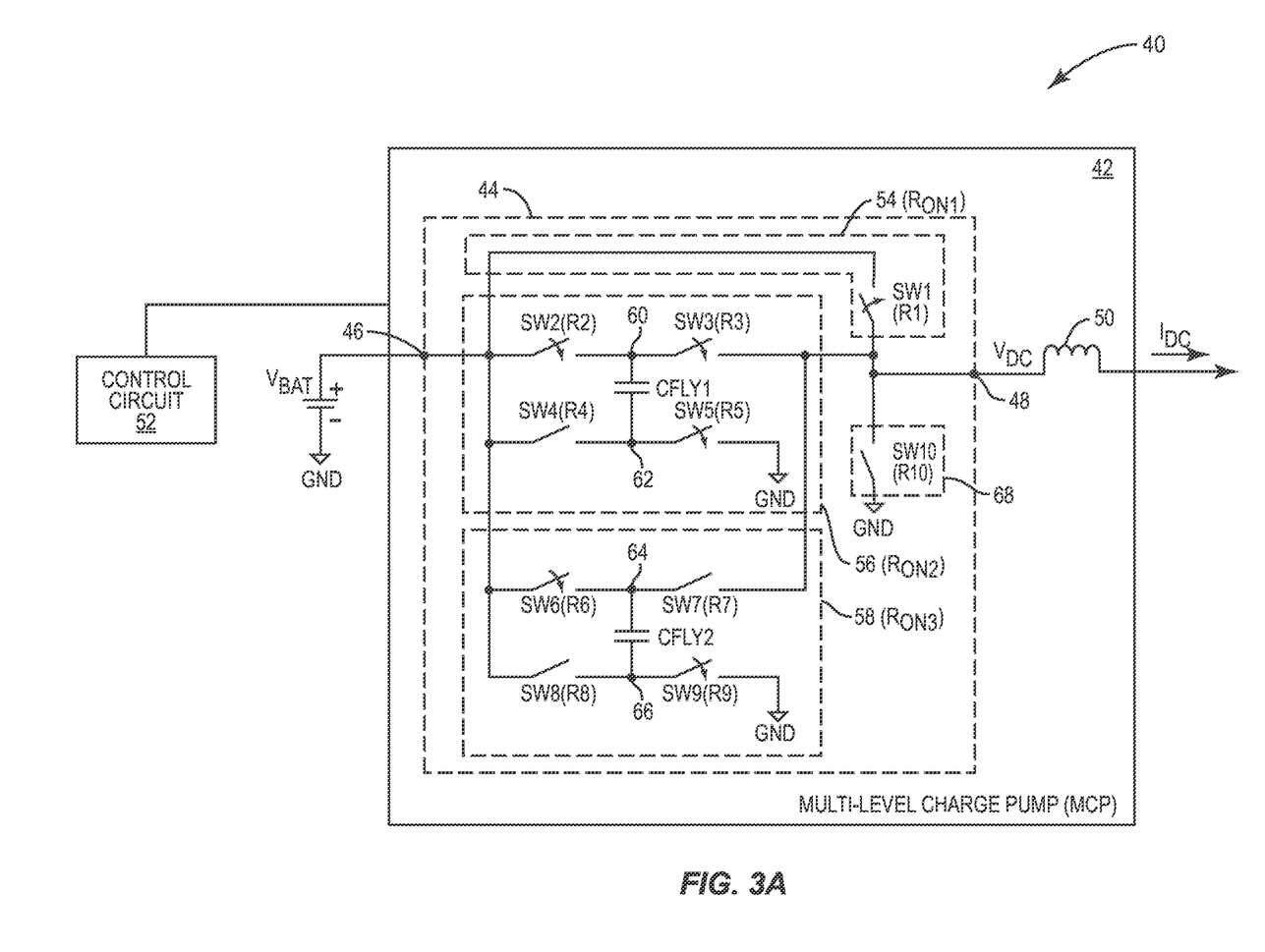
FIGS. 3A-3C are schematic diagrams providing exemplary illustrations of the MCP circuit of FIG. 2 configured according to various embodiments to reduce equivalent resistance in the buck mode operation.
Figure 3B:
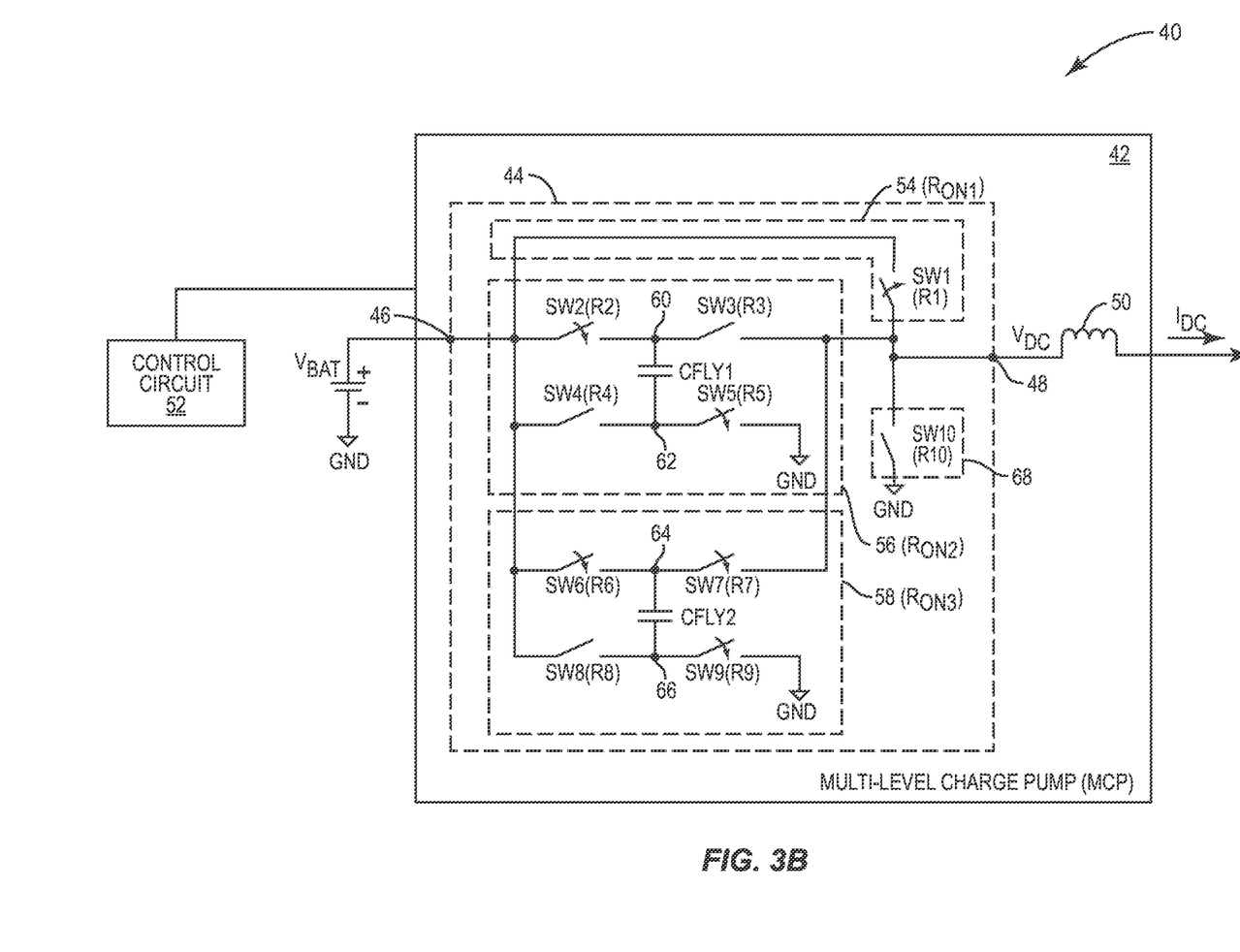
Figure 3C:
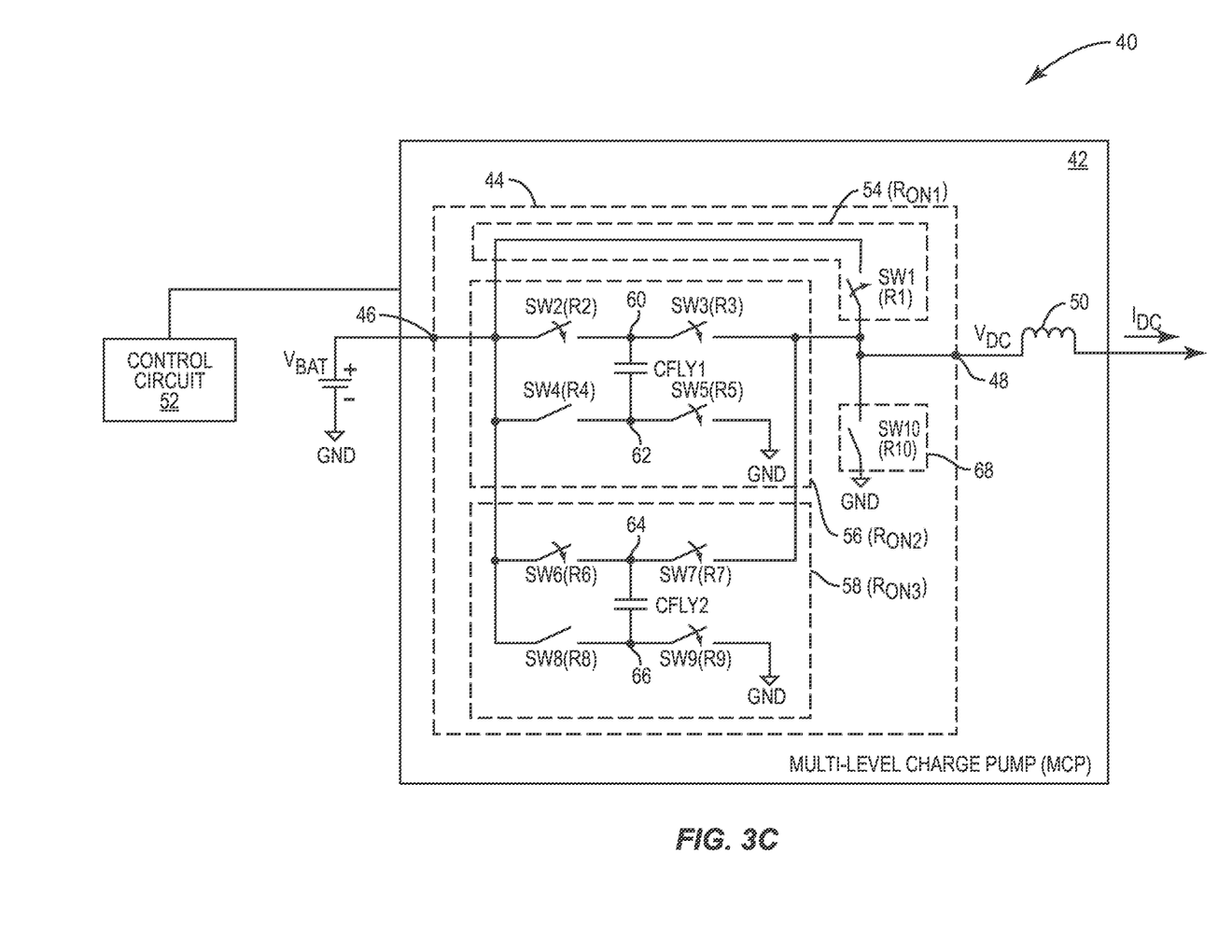

The multi-level voltage circuit 44 can be configured according to a number of embodiments to generate the low-frequency voltage $V_{DC}$ at the supply voltage $V_{BAT}$ in the buck mode operation with reduced equivalent resistance. In this regard, FIGS. 3A-3C are schematic diagrams providing exemplary illustrations of the MCP circuit 40 of FIG. 2 configured according to various embodiments to reduce equivalent resistance in the buck mode operation. Common elements between FIGS. 2 and 3A-3C are shown therein with common element numbers and will not be re-described herein.

With reference to FIG. 3A, the control circuit 52 can activate the first switch path 54 and at least one of the second switch path 56 and the third switch path 58 to help reduce the equivalent resistance of the multi-level voltage circuit 44. In one example, the control circuit 52 can activate the first switch path 54 and the second switch path 56. As a result, the multi-level voltage circuit 44 is able to generate the low-frequency voltage $V_{DC}$ at the supply voltage $V_{BAT}$ with the equivalent resistance of $R_{ON1} \| R_{ON2}$, which is smaller than the first on-resistance $R_{ON1}$ of the first switch path 54. Concurrent to activating the second switch path 56 in the buck mode operation, the control circuit 52 may also close the fifth switch SW5 to charge the first fly capacitor CFLY1. The control circuit 52 may further close the sixth switch SW6 and the ninth switch SW9 to charge the second fly capacitor CFLY2.

With reference to FIG. 3B, the control circuit 52 can activate the first switch path 54 and the third switch path 58. As a result, the multi-level voltage circuit 44 is able to generate the low-frequency voltage $V_{DC}$ at the supply voltage $V_{BAT}$ with the equivalent resistance of $R_{ON1} \| R_{ON3}$, which is smaller than the first on-resistance $R_{ON1}$ of the first switch path 54. Concurrent to activating the third switch path 58 in the buck mode operation, the control circuit 52 may also close the ninth switch SW9 to charge the second fly capacitor CFLY2. The control circuit 52 may further close the second switch SW2 and the fifth switch SW5 to charge the first fly capacitor CFLY1.

With reference to FIG. 3C, the control circuit 52 can activate the first switch path 54, the second switch path 56, and the third switch path 58. As a result, the multi-level voltage circuit 44 is able to generate the low-frequency voltage $V_{DC}$ at the supply voltage $V_{BAT}$ with the equivalent resistance of $R_{ON1} \| R_{ON2} \| R_{ON3}$, which is smaller than the first on-resistance $R_{ON1}$ of the first switch path 54. Concurrent to activating the second switch path 56 and the third switch path 58 in the buck mode operation, the control circuit 52 may also close the fifth switch SW5 and the ninth switch SW9 to charge first fly capacitor CFLY1 and the second fly capacitor CFLY2, respectively.

In a non-limiting example, the control circuit 52 can determine whether to activate the second switch path 56 and/or the third switch path 58 in the buck mode operation based on the low-frequency current $I_{DC}$. More specifically, the control circuit 52 may activate the second switch path 56 and/or the third switch path 58 only when the low-frequency current $I_{DC}$ is above a predefined threshold (e.g., 500 mA). The control circuit 52 may determine the amount of the low-frequency current $I_{DC}$ based on a feedback and/or the time-variant target voltage envelope associated with the ET target voltage $V_{TGT}$.

Figure 4A:
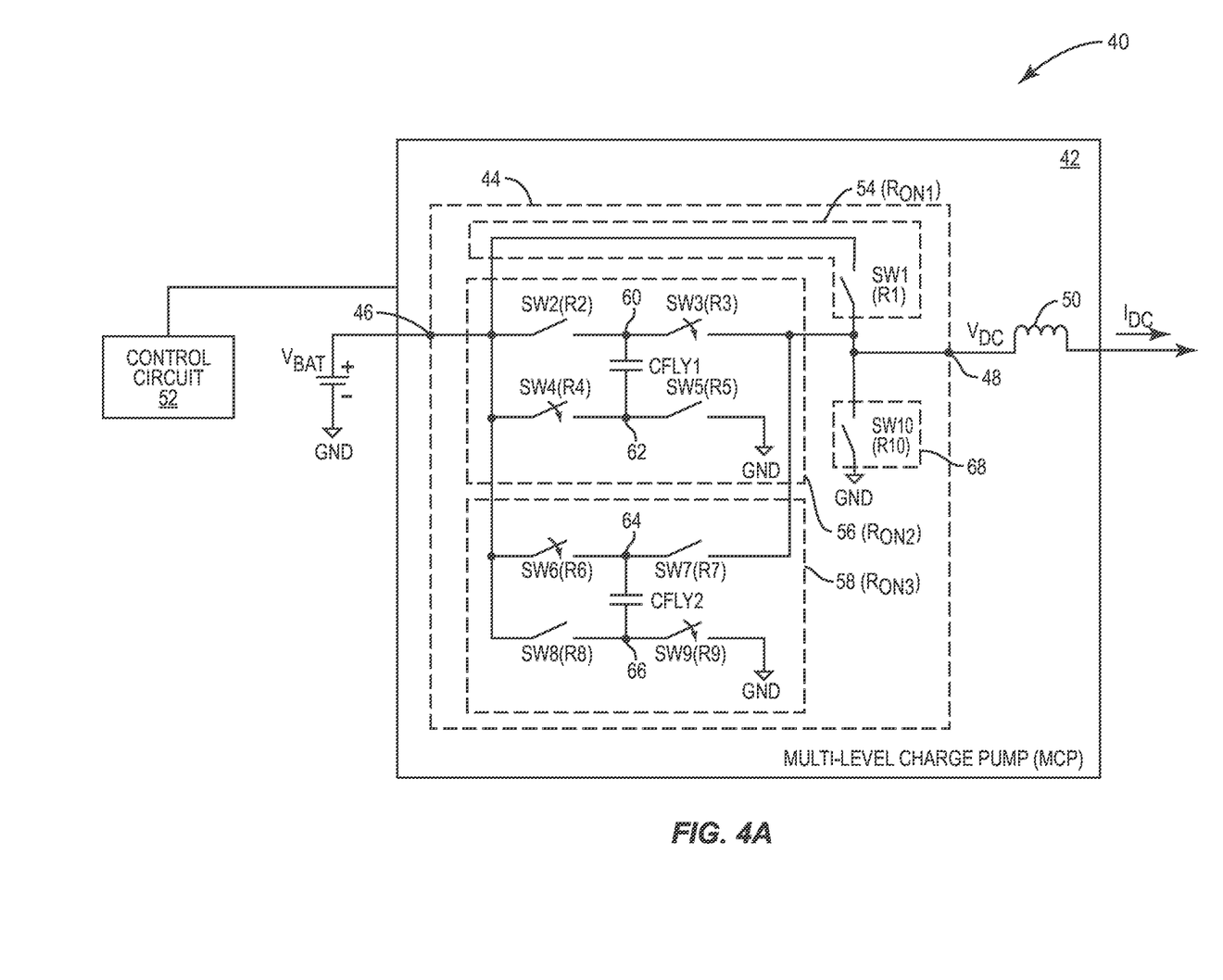
FIGS. 4A-4B are schematic diagrams providing exemplary illustrations of the MCP circuit of FIG. 2 configured according to various embodiments to prolong duty cycle in the boost mode operation.
Figure 4B:
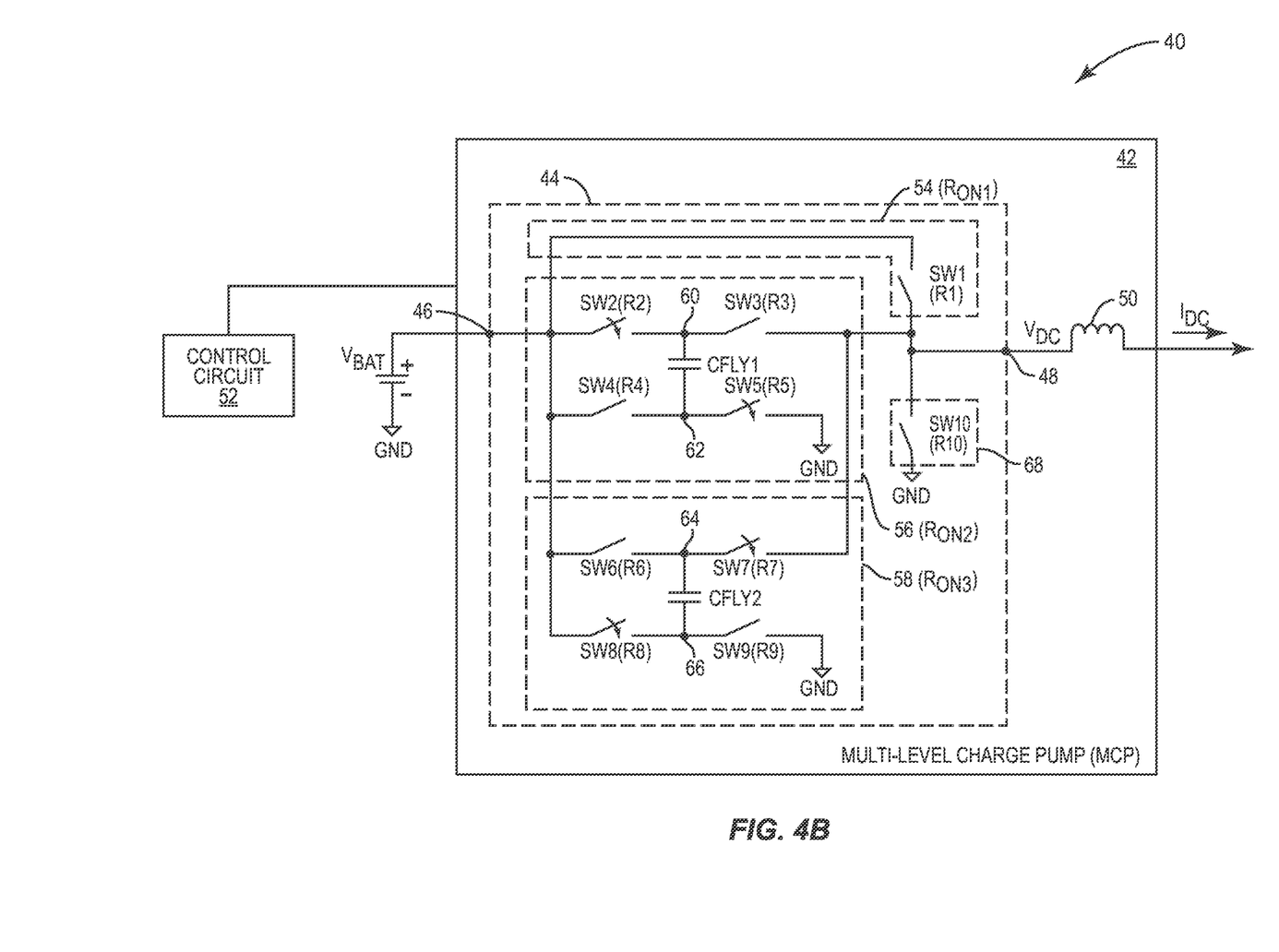

The multi-level voltage circuit 44 can be configured to generate the low-frequency voltage $V_{DC}$ at twice of the supply voltage $V_{BAT}$ in the boost mode operation with prolonged duty cycle. In this regard, FIGS. 4A-4B are schematic diagrams providing exemplary illustrations of the MCP circuit 40 of FIG. 2 configured to prolong the duty cycle in the boost mode operation. Common elements between FIGS. 2 and 4A-4B are shown therein with common element numbers and will not be re-described herein. As illustrated in FIGS. 4A and 4B, the control circuit 52 may alternately activate the second switch path 56 and the third switch path 58 to prolong the duty cycle in the boost mode operation.

With reference to FIG. 4A, the control circuit 52 closes the third switch SW3 and the fourth switch SW4 to activate the second switch path 56 in the boost mode operation. Concurrently, the control circuit 52 closes the sixth switch SW6 and the ninth switch SW9 to charge the second fly capacitor CFLY2.

Continue to FIG. 4B, when the second fly capacitor CFLY2 is charged above a voltage threshold, the control circuit 52 may open the third switch SW3, the fourth switch SW4, the sixth switch SW6, and the ninth switch SW9, while concurrently closing the seventh switch SW7 and the eighth switch SW8. As such, the third switch path 58 is activated to generate the low-frequency voltage $V_{DC}$ at twice the supply voltage $V_{BAT}$ and the first fly capacitor CFLY1 is charged. By toggling between the second switch path 56 and the third switch path 58, the multi-level voltage circuit 44 may prolong the duty cycle in the boost mode operation.

Figure 5:
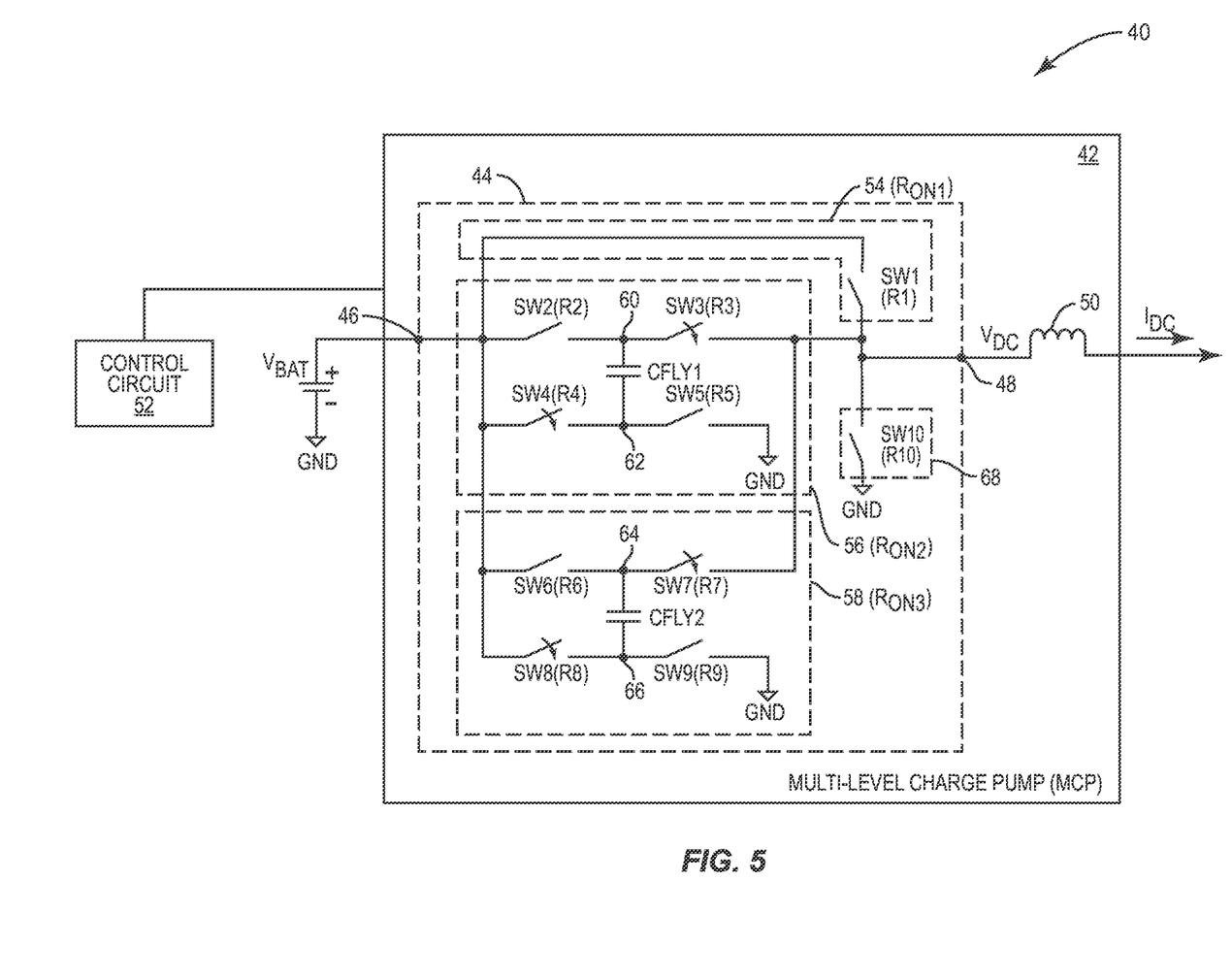
FIG. 5 is a schematic diagram providing an exemplary illustration of the MCP circuit of FIG. 2 in the boost mode operation.

The control circuit 52 may also activate the second switch path 56 and the third switch path 58 concurrently in the boost mode operation. In this regard, FIG. 5 is a schematic diagram providing an exemplary illustration of the MCP circuit 40 of FIG. 2 in the boost mode operation. Common elements between FIGS. 2 and 5 are shown therein with common element numbers and will not be re-described herein.

As illustrated in FIG. 5, the control circuit 52 activates the second switch path 56 by closing the third switch SW3 and the fourth switch SW4. Concurrently, the control circuit 52 activates the third switch path 58 by closing the seventh switch SW7 and the eighth switch SW8. Accordingly, the multi-level voltage circuit 44 generates the low-frequency voltage $V_{DC}$ at twice the supply voltage $V_{BAT}$.

Those skilled in the art will recognize improvements and modifications to the preferred embodiments of the present disclosure. All such improvements and modifications are considered within the scope of the concepts disclosed herein and the claims that follow.

What is claimed is:

1. A multi-level charge pump (MCP) circuit, comprising:
an MCP comprising a multi-level voltage circuit, the multi-level voltage circuit comprises:
an input node that receives a supply voltage;
an output node that outputs a low-frequency voltage;
a first switch path having a first on-resistance and is coupled between the input node and the output node; and
a second switch path having a second on-resistance and coupled between the input node and the output node in parallel to the first switch path, the second switch path comprising a first fly capacitor to be charged to provide a first boost voltage between the input node and the output node to thereby boost the low-frequency voltage above the supply voltage; and
a third switch path having a third on-resistance and coupled between the input node and the output node in parallel to the first switch path and the second switch path, the third switch path comprising a second fly capacitor to be charged to provide a second boost voltage between the input node and the output node to thereby boost the low-frequency voltage above the supply voltage; and
a control circuit configured to:
in a buck mode operation, activate the first switch path and at least one of the second switch path and the third switch path to cause the multi-level voltage circuit to output the low-frequency voltage at the supply voltage with an equivalent resistance smaller than the first on-resistance; and
in a boost mode operation, deactivate the first switch path and activate one of the second switch path and the third switch path in response to a respective one of the first boost voltage and the second boost voltage being above a voltage threshold to cause the multi-level voltage circuit to maintain the low-frequency voltage above the supply voltage.

2. The MCP circuit of claim 1 wherein the MCP further comprises a power inductor coupled to the output node and configured to induce a low-frequency current based on the low-frequency voltage.

3. The MCP circuit of claim 2 wherein, in the buck mode operation, the control circuit is further configured to activate the at least one of the second switch path and the third switch path in response to the low-frequency current being above a predefined threshold.

4. The MCP circuit of claim 1 wherein, in the buck mode operation, the control circuit is further configured to activate the second switch path and the third switch path to cause the multi-level voltage circuit to output the low-frequency voltage equaling the supply voltage with the equivalent resistance being smaller than the first on-resistance.

5. The MCP circuit of claim 1 wherein, in the boost mode operation, the control circuit is further configured to activate the second switch path and the third switch path to cause the multi-level voltage circuit to output the low-frequency voltage at twice the supply voltage.

6. The MCP circuit of claim 1 wherein, in the boost mode operation, the control circuit is further configured to activate alternately the second switch path and the third switch path to cause the multi-level voltage circuit to output the low-frequency voltage at twice the supply voltage.

7. The MCP circuit of claim 1 wherein the multi-level voltage circuit further comprises a fourth switch path coupled between the output node and a ground, wherein the control circuit is further configured to activate the fourth switch path while deactivating the first switch path, the second switch path, and the third switch path to cause the multi-level voltage circuit to output the low-frequency voltage at zero volt (0 V).

8. The MCP circuit of claim 1 wherein:
the first switch path comprises a first switch coupled between the input node and the output node;
the second switch path comprises:
- a second switch and a third switch coupled in series between the input node and the output node;
- a fourth switch and a fifth switch coupled in series between the input node and a ground; and
- the first fly capacitor coupled between a first intermediate node located between the second switch and the third switch and a second intermediate node located between the fourth switch and the fifth switch; and the third switch path comprises:
- a sixth switch and a seventh switch coupled in series between the input node and the output node;
- an eighth switch and a ninth switch coupled in series between the input node and the ground; and
- the second fly capacitor coupled between a third intermediate node located between the sixth switch and the fifth switch and a fourth intermediate node located between the eighth switch and the ninth switch.

9. The MCP circuit of claim 8 wherein, in the buck mode operation, the control circuit is further configured to close the first switch to activate the first switch path, close the second switch and the third switch to activate the second switch path, and close the sixth switch and the seventh switch to activate the third switch path to cause the multi-level voltage circuit to output the low-frequency voltage at the supply voltage with the equivalent resistance being smaller than the first on-resistance.

10. The MCP circuit of claim 9 wherein the control circuit is further configured to close the fifth switch and the ninth switch to concurrently charge the first fly capacitor and the second fly capacitor.

11. The MCP circuit of claim 8 wherein, in the boost mode operation, the control circuit is further configured to open the first switch to deactivate the first switch path, close the third switch and the fourth switch to activate the second switch path, and close the seventh switch and the eighth switch to activate the third switch path to cause the multi-level voltage circuit to output the low-frequency voltage at twice the supply voltage.

12. The MCP circuit of claim 11 wherein the control circuit is further configured to:
- open the second switch and the fifth switch to disable charging of the first fly capacitor; and
- open the sixth switch and the ninth switch to disable charging of the second fly capacitor.

13. The MCP circuit of claim 8 wherein, in the boost mode operation, the control circuit is further configured to open the first switch to deactivate the first switch path, close the third switch and the fourth switch to activate the second switch path, and open the seventh switch to deactivate the third switch path to cause the multi-level voltage circuit to output the low-frequency voltage at twice the supply voltage.

14. The MCP circuit of claim 13 wherein the control circuit is further configured to close the sixth switch and the ninth switch to concurrently charge the second fly capacitor.

15. The MCP circuit of claim 14 wherein the control circuit is further configured to open the first switch to deactivate the first switch path, open the fourth switch to deactivate the second switch path, and close the seventh switch and the eighth switch to activate the third switch path to cause the multi-level voltage circuit to output the low-frequency voltage at twice the supply voltage.

16. The MCP circuit of claim 15 wherein the control circuit is further configured to activate the third switch path and deactivate the second switch path in response to the second fly capacitor being charged above a voltage threshold.

17. The MCP circuit of claim 16 wherein the control circuit is further configured to close the second switch and the fifth switch to concurrently charge the first fly capacitor.

18. The MCP circuit of claim 17 wherein the control circuit is further configured to open the first switch to deactivate the first switch path, close the third switch and the fourth switch to activate the second switch path, and open the seventh switch to deactivate the third switch path to cause the multi-level voltage circuit to output the low-frequency voltage at twice the supply voltage.

19. The MCP circuit of claim 18 wherein the control circuit is further configured to activate the second switch path and deactivate the third switch path in response to the first fly capacitor being charged above the voltage threshold.

* * * * *